United States Patent [19]
Bosnyak et al.

[11] Patent Number: 5,783,953
[45] Date of Patent: Jul. 21, 1998

[54] CMOS CURRENT CONTROLLED DELAY ELEMENT USING CASCODED COMPLEMENTARY DIFFERENTIAL AMPLIFIERS WITH REPLICATED BIAS CLAMP

[75] Inventors: Robert J. Bosnyak, San Jose; Robert J. Drost, Palo Alto, both of Calif.

[73] Assignee: Sun Microsystems, Inc., Mountain View, Calif.

[21] Appl. No.: 671,301

[22] Filed: Jul. 1, 1996

[51] Int. Cl.$^6$ .................... H03B 5/02; H03K 5/13
[52] U.S. Cl. .................... 327/101; 327/100; 327/309; 327/285; 327/287; 327/288; 331/57
[58] Field of Search .................... 331/57; 327/100, 327/101, 309, 314, 563, 129, 264, 285, 287, 288

[56] References Cited

U.S. PATENT DOCUMENTS 5,300,898  4/1994  Chen et al. .................... 327/101
5,446,412  8/1995  Kimyacioglu et al. .................... 330/285

OTHER PUBLICATIONS

Gray and Meyer, *Analysis and Design of Analog Integrated Circuits*, Chapter 10, pp. 681–713.

Maneatis, J.G., "Low-Jitter and Process-Independent DLL and PLL Based on Self-Biased Techniques," *Digest of Technical Papers*, 1996 IEEE International Solid-State Circuits Conference, Paper No. FA8.1, pp. 130–131.

von Kaenel, V., et al., "A 320MHz 1.5mW at 1.35V CMOS PLL for Microprocessor Clock Generation," *Digest of Technical Papers*, 1996 IEEE International Solid-State Circuits Conference, Paper No. FA8.2, pp. 132–133.

Zhang, Zhong-Xuan, et al., "a 360MHz 3v CMOS PLL with 1V Peak-to-Peak Power Supply Noise Tolerance," *Digest of Technical Papers*, 1996 IEEE International Solid-State Circuits Conference, Paper No. Fa8.3, pp. 134–135.

*Primary Examiner*—Timothy P. Callahan
*Assistant Examiner*—Dinh Le
*Attorney, Agent, or Firm*—Townsend and Townsend and Crew LLP

[57] ABSTRACT

A cascoded cmos differential delay element is described. The delay element provides a controlled delay useful in forming voltage controlled oscillators or other circuits. The delay element provides high gain enabling it to be useful in multistage delay element circuits. The circuit described includes cascoded complementary differential amplifiers and replicated bias clamps.

11 Claims, 2 Drawing Sheets

CMOS CURRENT CONTROLLED DELAY ELEMENT USING CASCODED COMPLEMENTARY DIFFERENTIAL AMPLIFIERS WITH REPLICATED BIAS CLAMP

BACKGROUND OF THE INVENTION

This invention relates to electronic circuits. In particular, the invention relates to integrated circuits which provide controllable delay functions, for example, in voltage controlled oscillators.

In the design of many digital systems, time delay elements are required which provide a controlled and repeatable delay to "time" an event. "Timing" in this sense means that a specific time delay should occur prior to a next event. One such example is in the design of systems employing serial data communication. In such systems, voltage controlled delay elements can be used to help encode information or decode information supplied over the serial data channel. An example of such a system is described in commonly-assigned copending U.S. patent application Ser. No. 08/254,326, filed Jun. 6, 1994, entitled "High Speed Serial Link for Fully Duplexed Data Communication," by Deog-Kyoon Jeong.

Many forms of delayed locked loops (DLL) and phase locked loops (PLL) use a string of delay elements that are connected in a feedback arrangement to create an oscillator. The frequency of oscillation is a function of the individual delay times of the delay elements. In other words, as an event propagates through the chain of delay elements, each element delays the event by a controllable period, or a set time, before the next element is triggered, in turn creating further delay.

There are several attributes desirable in a delay element. Sufficient gain is important because an input signal must be regenerated at an output of the delay element with enough fidelity to be useful for subsequent stages. Repeatability is also important, that is, for a given set of conditions such as process parameters, temperature, supply voltages, control voltages, etc., the delay should be the same. Another desirable feature of delay elements is wide range. Because various combinations of manufacturing variables are possible, a wider range of control allows compensation for a wider range of manufacturing variations. High speed is also important. As overall integrated circuit technology improves the speed of communications and computing, the required controlled delays, in turn, become shorter. For example, a phase locked loop integrated circuit may recover a clock signal from a data stream generated by a network link. The clock is at the bit rate of the incoming data and requires an internal oscillator in the phase lock loop circuit of the receiver to run at that frequency. As a result of continuing improvements in semiconductor technology, the frequency has increased from rates in the megaHertz range to the gigaHertz range. Thus, high speed can be an important attribute of a delay element.

Another important attribute is rejection of exogenous noise. Noise has the deleterious effect of reducing almost all of the good attributes of a delay element. Too much noise can cause erroneous trigger events, thereby degrading gain, fidelity, and repeatability. Furthermore, delay is increased as power decreases. Nodal impedances increase, making circuits more susceptible to coupled noise. Therefore, signal-to-noise ratios are decreased as delays are increased. Noise is also affected by speed in another manner. In PLL or DLL circuits, noise can be considered as represented by an injected phase error. Thus, for a set amount of noise coupled to the controls of the delay element, delay elements with faster speed have the highest phase error percentage. In other words, the injected phase error is a higher percentage of the overall period of oscillation for circuits operating at higher speeds, rather than lower speeds.

SUMMARY OF THE INVENTION

An embodiment of this invention provides an improved delay element for a voltage controlled oscillator, or other application. The delay element provides high gain, a wide operating range, high speed, and noise rejection. An important aspect of the invention is the cascading of two complementary differential amplifiers. The use of the differential amplifiers helps minimize sensitivity to power supply noise which was reflected in the output signals of prior art delay elements.

In one embodiment, a circuit according to this invention includes a high potential source, a low potential source, and a first differential amplifier connected to first and second input nodes to receive first and second input signals, and connected to first and second output nodes for supplying first and second output signals. A second differential amplifier is cascoded with the first differential amplifier, by being connected to the first and second input nodes to also receive the first and second input signals, and to the first and second output nodes for also supplying the first and second output signals. A first transistor having a control electrode coupled to receive a first bias signal, is coupled between the first differential amplifier and the high potential source; and a second transistor having a control electrode coupled to receive a second bias signal, is coupled between the second differential amplifier and the low potential source. In this manner the current through the first and second transistors controls the delay element.

DESCRIPTION OF THE SPECIFIC EMBODIMENTS

Figure 1:
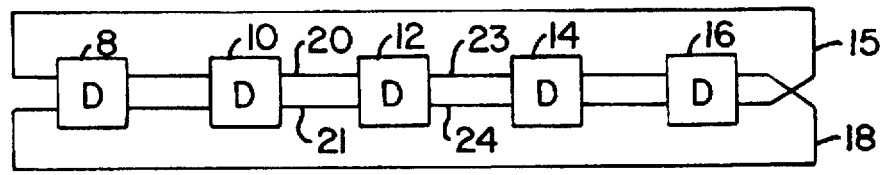
FIG. 1 is a block diagram illustrating a prior art voltage controlled oscillator.

FIG. 1 illustrates a prior art voltage controlled oscillator. As shown in FIG. 1, the oscillator is made up of a series of delay elements 8, 10, 12, 14 and 16 which are serially connected, and coupled between a high and a low potential source (not shown) to power each element. The output terminals 15, 18 of the last delay element 16 are cross-coupled to the input terminals of the first delay element 8. A start-up circuit (not shown) will place the first stage element 8 in one state or the other to begin the oscillations. In operation, the frequency of oscillation of the circuit shown in FIG. 1 is set by a control voltage input (not shown) to each of the stages. The important aspect of the operation of the circuit shown in FIG. 1 is that it oscillates. The output of each delay stage 8 is received by the subsequent delay stage 10, in turn causing the output of the subsequent stage to change and thereby change the input conditions for the next delay stage 12. This process is repeated, creating an oscillating signal within the circuit. By providing connections to the conductors between stages, or to the output terminals 15 or 18, the oscillating signal can be used to control other circuitry (not shown).

Figure 2:
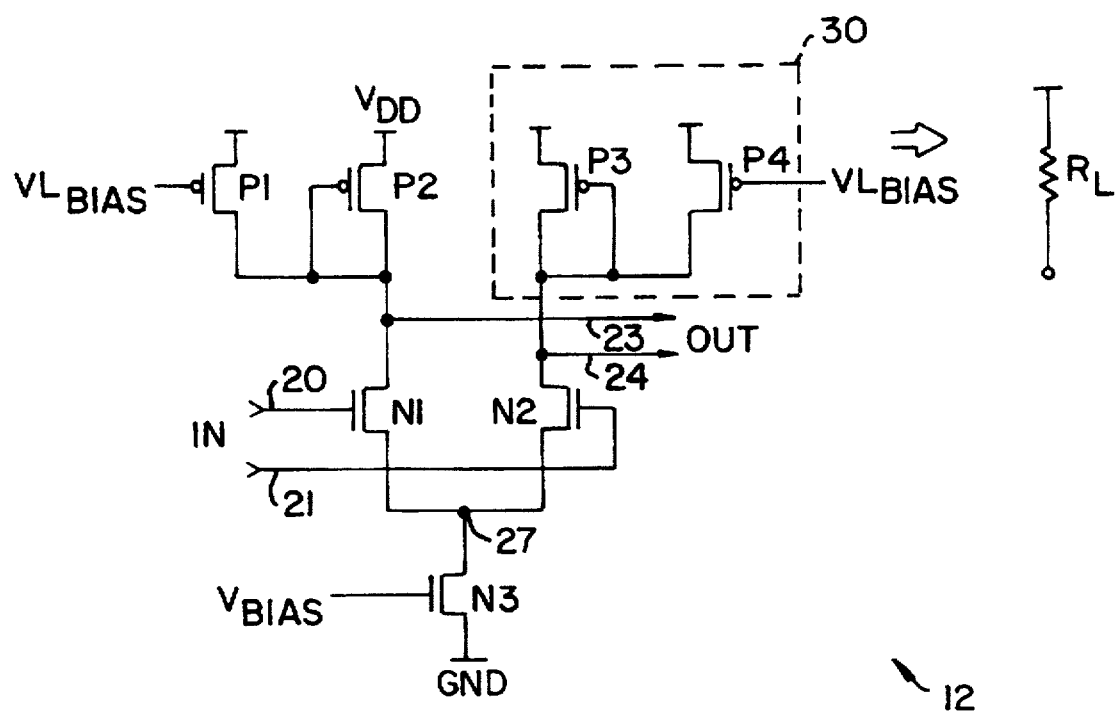
FIG. 2 is a circuit schematic of a prior art delay element, for example, as used in FIG. 1.

FIG. 2 is a circuit schematic illustrating in more detail the internal structure of one of the prior art delay elements, for example, delay element 12. The two input signals to the circuit shown in FIG. 2 are designated IN, and received on input terminals 20 and 21. The two output signals, designated OUT, are supplied at nodes 23 and 24. As shown by FIG. 1, nodes 20 and 21 are connected to the receive output signals from delay element 10, while the output signals on nodes 23 and 24 are connected to provide input signals to delay element 14.

The circuit shown in FIG. 2 includes pmos transistors P1, P2, P3 and P4. Pmos transistors P1 and P2 are connected between a potential supply $V_{DD}$ and node 23, while pmos transistors P3 and P4 are connected between potential supply $V_{DD}$ and node 24. Nmos transistors N1 and N2 are connected between nodes 23 and 24 and node 27, respectively. The input terminals 20 and 21 are connected to the control electrodes of transistors N1 and N2, respectively. Finally, a bias signal $V_{BIAS}$ controlling nmos transistor N3 provides a current sink for node 27.

The circuit shown in FIG. 2 includes a dashed box 30 surrounding a portion of the circuit. In this portion of the circuit, transistor P3 is connected as a diode, and transistor P4 connected to another bias supply $V_{BIAS}$. Connecting the transistors in this manner provides a passive load for the output node 24, and can be viewed as an approximation to providing a resistor $R_L$, as indicated toward the right-hand side of FIG. 2. At low currents, the passive resistor $R_L$ becomes too large, and generates large amounts of thermal noise onto nodes 23 and 24. Also a large resistor $R_L$ makes nodes 23 and 24 more sensitive to coupled noise from the power supplies or other sources. Another problem with the circuit shown in FIG. 2 is that it is gain limited.

For the circuit shown in FIG. 2, gain is expressed as:

$$Av = g_{mn} R_L \tag{1}$$

where:

Av is the voltage gain $V_{out}/V_{in}$, and $g_{mn}$ is the transconductance of the nmos differential pair Because:

$$g_{mn} = k(W/L)(V_{gs} - V_t) \tag{2}$$

where:

k is a process constant

W is the gate width

L is the gate length $V_{gs}$ is the gate to source voltage, and $V_t$ is the threshold voltage (nmos)

Figure 3:
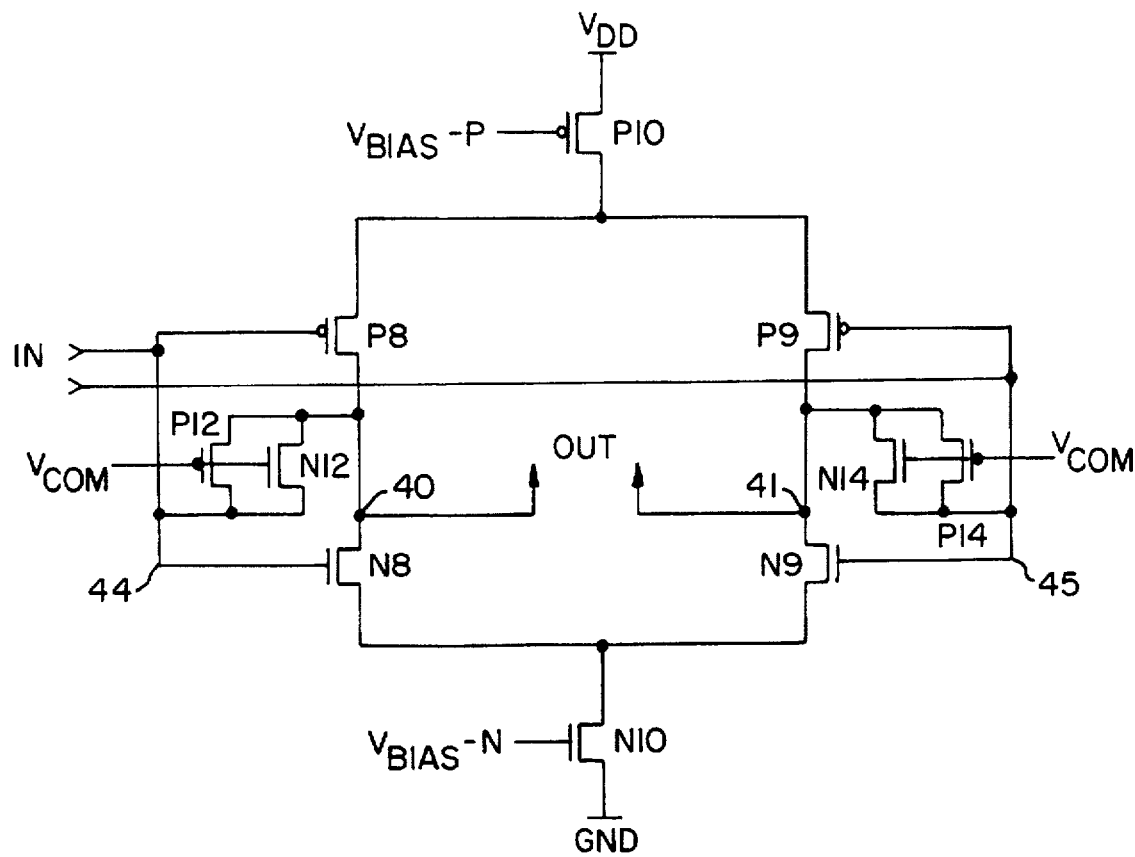
FIG. 3 is a circuit schematic of an embodiment of the invention.

FIG. 3 is a circuit schematic illustrating a preferred embodiment of the invention. The circuit shown in FIG. 3 provides two cascoded complementary differential amplifiers. One differential amplifier consists of parallel connected pmos transistor P8 and pmos transistor P9. The other differential amplifier consists of parallel connected nmos transistor pair N8 and N9. A first input signal to the cascoded differential amplifiers is connected to the commonly coupled control gates of transistors P8 and N8. A complementary input signal to the cascoded differential amplifiers is connected to the commonly coupled control gates of transistors P9 and N9.

As shown, the cascoded amplifiers are connected between an upper potential supply $V_{DD}$ and a lower potential supply GND. The potential supplies are coupled to the differential amplifiers through biasing transistors P10 and N10. Pmos transistor P10 has its control electrode connected to receive a bias signal $V_{BIAS}$-P, while nmos transistor has its control electrode connected to receive bias signal $V_{BIAS}$-N. The output terminals for the circuit are terminals 40 and 41. As shown, one output terminal is coupled in common to transistors P8 and N8, and the other output terminal is coupled in common to transistors P9 and N9. The output terminals are designated OUT.

Also shown in FIG. 3 are two optional clamp circuits. A first clamp circuit consisting of transistor P12 and transistor N12 is connected between nodes 40 and 44, while a second clamp circuit consisting of transistors N14 and P14 is connected between nodes 41 and 45. These clamps are discussed in more detail below.

The $V_{BIAS}$ signal shown in FIG. 3 is used to bias both the P channel transistor P10 and the N transistor N10 the same. The output voltage is set to be midway between the two bias voltages so that it occurs at the transition point where both transistors are in the saturated region. It is also desirable that the N and P channel devices shown in FIG. 3 have the same transconductance. To achieve this, the N channel devices N8 and N9 will be roughly half as big as the P channel devices P8 and P9.

For the circuit shown in FIG. 3, $$Av = (g_{mp} + g_{mn}) \cdot (rop \| ron) \tag{3}$$

where:

$g_{mp}$ is the pmos differential pair transconductance $g_{mn}$ is the nmos differential pair transconductance rop is the small signal pmos gate length modulation resistance ron is the small signal nmos gate length modulation resistance $\|$ means in parallel The gain of the circuit shown in FIG. 3 will be much higher than the gain of the circuit shown in FIG. 2. Noise rejection from the power supply ($V_{DD}$) is enhanced because the sources of both differential amplifiers in FIG. 3 are fed by current sinks, and are not connected directed to the power supplies.

As mentioned above, in a preferred embodiment of the invention additional clamp circuits are added, as also shown in FIG. 3. Each clamp circuit consists of a pair of pmos and nmos transistors tied between an input terminal and an output terminal, where the pair has a common gate bias $V_{COM}$. This bias is a replicated voltage for the transition voltage at which the input voltage equals the output voltage. In addition to adjusting the operating point, the clamp limits the excursions of the output nodes by shunting excess current during extreme differential input voltage situations. The clamps limit the output voltage excursions to a threshold voltage above and below $C_{COM}$. If it is desired to make the delay element shown in FIG. 3 have a smaller swing and thus a shorter delay, the clamp is made smaller. Other clamp options are also possible, for example, a pair of Schottky diodes could be used to limit the excursions of the clamped nodes 40 and 44, and 41 and 45. Thus, the clamp helps make the delay of the stage more predictable and controllable.

Figure 4:
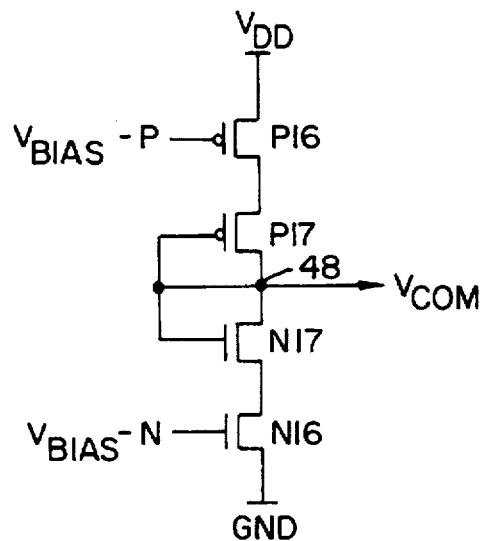
FIG. 4 is a circuit schematic illustrating the generation of the control signals for the replicated bias clamps shown in FIG. 3.

To the first order, the voltage swing at the output of the circuit shown in FIG. 3 is:

$$V_{oh} = C_{COM} + V_{tp} \tag{4}$$

$$V_{ol} = C_{COM} - V_{tn} \tag{5}$$

where:

$C_{COM}$ is the replicated bias level $V_{tp}$ is the pmos transistor threshold voltage $V_{tn}$ is the nmos transistor threshold voltage Assuming that:

$$V_{tn} = V_{tp} = V_t = 0.8 \text{ volts} \tag{6}$$

then the output excursion will be 1.6 volts. Thus, the delay of the stage will be approximately:

$$t_d = I_O \cdot (V_t / C_t) \tag{7}$$

where:

$I_O$ is the matched tail currents of each differential pair $V_t$ is the threshold voltage $C_t$ is the nodal capacitance FIG. 4 is a circuit schematic illustrating the manner in which the common voltage $C_{COM}$ is generated. As shown in FIG. 4, a first pmos transistor P16, a second pmos transistor P17, a first nmos transistor N16 and a second nmos transistor N17 are all serially connected between a higher potential $V_{DD}$ and a lower potential ground. The gates of P16 and N16 are connected to receive the appropriate bias voltage $V_{BIAS}$. These are the same bias voltages applied to the transistors P10 and N10 in FIG. 3, and function to make the transconductance of the transistors substantially equal. The gates of transistors N17 and P17 are tied together and to the node 48 between them. The potential of node 48 is used as the common voltage. This is the voltage supplied to the clamp circuits shown in FIG. 3.

The foregoing has been a description of several embodiments of the invention, in particular, embodiments using and not using clamp circuits to provide a more reliable uniform delay element, for example in voltage control oscillators. These embodiment were presented for purposes of explanation. The scope of the invention is defined by the appended claims in light of their full scope of equivalents.

What is claimed is:

1. A circuit connected between a high potential source and a low potential source, the circuit comprising:

a first differential amplifier connected to first and second input nodes to receive first and second input signals, and connected to first and second output nodes for supplying first and second output signals;

a second differential amplifier connected to the first and second input nodes to also receive the first and second input signals, and connected to first and second output nodes for also supplying the first and second output signals;

a first transistor having a control electrode coupled to receive a first bias signal, the first transistor coupled between the first differential amplifier and the high potential source;

a second transistor having a control electrode coupled to receive a second bias signal, the second transistor coupled between the second differential amplifier and the low potential source;

a first clamp circuit coupled between the first input node and the first output node; and a second clamp circuit coupled between the second input node and the second output node.

2. The circuit as in claim 1 wherein the first differential amplifier comprises a first pmos transistor connected between the first transistor and the first output node and having a control electrode connected to the first input node, and a second pmos transistor connected between the first transistor and the second output node and having a control electrode connected to the second input node.

3. The circuit as in claim 1 wherein the second differential amplifier comprises a first nmos transistor connected between the second transistor and the first output node and having a control electrode connected to the first input node, and a second nmos transistor connected between the second transistor and the second output node and having a control electrode connected to the second input node.

4. The circuit as in claim 1 wherein the first transistor comprises a pmos transistor and the second transistor comprises an nmos transistor.

5. The circuit as in claim 1 wherein:

the first clamp circuit comprises a first cmos pair of transistors coupled between the first input node and the first output node; and the second clamp circuit comprises a second cmos pair of transistors coupled between the second input node and the second output node.

6. The circuit as in claim 5 wherein the first cmos pair of transistors have gates coupled together and to a common potential, and the second cmos pair of transistors have gates coupled together and to the common potential.

7. The circuit as in claim 6 further comprising a circuit for generating the common potential at a common node comprising:

a first pmos transistor coupled between the high potential and a first node and having a control electrode coupled to receive the first bias signal;

a first nmos transistor coupled between the low potential and a second node and having a control electrode coupled to receive the second bias signal;

a second pmos transistor coupled between the first node and the common node and having a control electrode coupled to the common node; and a second nmos transistor coupled between the second node and the common node and having a control electrode coupled to the common node.

8. A voltage controlled oscillator circuit connected between a high potential source and a low potential source, the circuit comprising:

a plurality of stages, each stage comprising:

a first differential amplifier connected to first and second input nodes to receive first and second input signals, and connected to first and second output nodes for supplying first and second output signals;

a second differential amplifier connected to the first and second input nodes to also receive the first and second input signals, and connected to first and second output nodes for also supplying the first and second output signals;

a first transistor having a control electrode coupled to receive a first bias signal, the first transistor coupled between the first differential amplifier and the high potential source;

a second transistor having a control electrode coupled to receive a second bias signal, the second transistor coupled between the second differential amplifier and the low potential source;

a first clamp circuit coupled between the first input node and the first output node;

a second clamp circuit coupled between the second input node and the second output node; and wherein the first and second output signals from each stage are coupled to provide as the next first and second input signals to the next stage.

9. The circuit as in claim 8 wherein the first differential amplifier comprises a first pmos transistor connected between the first transistor and the first output node and having a control electrode connected to the first input node, and a second pmos transistor connected between the first transistor and the second output node and having a control electrode connected to the second input node.

10. The circuit as in claim 9 wherein the second differential amplifier comprises a first nmos transistor connected between the second transistor and the first output node and having a control electrode connected to the first input node, and a second nmos transistor connected between the second transistor and the second output node and having a control electrode connected to the second input node.

11. The circuit as in claim 10 wherein each of the first and the second pmos transistors have a channel width which is twice the channel width of each of the first and the second nmos transistors.

* * * * *